(12) United States Patent
Kozhikkottu et al.

(10) Patent No.: US 10,862,622 B2
(45) Date of Patent: Dec. 8, 2020

(54) ERROR CORRECTION CODE (ECC) AND DATA BUS INVERSION (DBI) ENCODING

(71) Applicant: Intel Corporation, Santa Clara, CA (US)

(72) Inventors: Vivek Joy Kozhikkottu, Hillsboro, OR (US); Shankar Ganesh Ramasubramanian, Hillsboro, OR (US); Dinesh Somasekhar, Portland, OR (US); Melin Dadual, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/420,504

(22) Filed: May 23, 2019

(65) Prior Publication Data
US 2019/0280813 A1 Sep. 12, 2019

(51) Int. Cl.
*H04L 1/00* (2006.01)
(52) U.S. Cl.
CPC ................. *H04L 1/0041* (2013.01)
(58) Field of Classification Search
None
See application file for complete search history.

(56) References Cited

U.S. PATENT DOCUMENTS

| | | | | |
|---|---|---|---|---|
| 5,910,959 | A * | 6/1999 | Olafsson | H04L 1/0025 370/522 |
| 8,127,204 | B2 * | 2/2012 | Hargan | G06F 11/1625 714/766 |
| 8,407,558 | B2 * | 3/2013 | Abbasfar | G06F 11/1004 714/755 |
| 2014/0071743 | A1 * | 3/2014 | Kim | G06F 13/4234 365/158 |
| 2015/0194984 | A1 * | 7/2015 | Tsuboi | H03M 13/095 714/758 |
| 2016/0173128 | A1 * | 6/2016 | Ware | G06F 11/1008 714/768 |
| 2018/0159558 | A1 * | 6/2018 | Cha | H03M 13/09 |
| 2018/0357188 | A1 * | 12/2018 | Brief | G06F 13/42 |
| 2019/0102254 | A1 * | 4/2019 | Saxena | H03M 13/19 |

OTHER PUBLICATIONS

"Jafarzadeh, Data Encoding Techniques for Reducing Energy, March 2014, (IEEE Transactions on Very Large Scale Integration (VLSI) Systems, vol. 22, No. 3" (Year: 2014).*

* cited by examiner

*Primary Examiner* — Cynthia Britt
*Assistant Examiner* — Matthew W Wahlin
(74) *Attorney, Agent, or Firm* — Patent Capital Group (57) ABSTRACT

Embodiments may relate to a processor to an electronic device that includes an error correction code (ECC) encoder that is to perform ECC encoding on aa data message to generate an ECC encoded data message. The electronic device may further include a data bus inversion (DBI) encoder communicatively coupled with the ECC encoder, wherein the DBI encoder is to perform DBI encoding on the ECC encoded data message to generate a DBI encoded data message. Other embodiments may be described or claimed.

20 Claims, 8 Drawing Sheets

Figure 1

| | 1 | 2 | 3 | 4 | 5 | 6 | 7 | 8 |
|---|---|---|---|---|---|---|---|---|
| 8 bit Message m | 1 | 0 | 1 | 1 | 0 | 1 | 1 | 0 |
| G (shortened) 8x5 | 1 | 1 | 0 | 0 | 1 | | | |
| | 0 | 1 | 1 | 1 | 0 | | | |
| | 1 | 0 | 0 | 1 | 1 | | | |
| | 1 | 1 | 1 | 0 | 0 | | | |
| | 1 | 0 | 1 | 0 | 0 | | | |
| | 0 | 1 | 0 | 0 | 1 | | | |
| | 1 | 1 | 1 | 1 | 1 | | | |
| | 0 | 0 | 0 | 0 | 1 | | | |

ERROR CORRECTION CODE (ECC) AND DATA BUS INVERSION (DBI) ENCODING

BACKGROUND

When transmitting data in computing systems, it may be desirable to encode the data in accordance with one or more algorithms. One such algorithm may include error correction code (ECC) encoding. Another such algorithm may include data bus inversion (DBI) encoding.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Various operations may be described as multiple discrete operations in turn, in a manner that is most helpful in understanding the claimed subject matter. However, the order of description should not be construed as to imply that these operations are necessarily order dependent.

As noted above, various encoding techniques may be applied to data when the data is transferred within a computing system. Examples of such codes may include ECC encoding, DBI encoding, etc. The ECC encoding may include various types of encoding techniques such as single-error correction (SEC), single-error correction/double error detection (SECDED), double error correction/triple error detecting (DECTED), etc.

However, in some embodiments it may be desirable to apply both ECC encoding and DBI encoding, as each technique may present different benefits for data transfer. Generally, application of DBI encoding prior to ECC encoding may be inefficient, as the DBI encoding may require identifying the current value of a bus and then applying DBI with respect to the current value. DBI encoding may be latency constrained and, in addition, a resource-expensive ECC decoding and re-encoding may need to be performed in addition to the DBI encoding. This resource-expensive ECC decoding/re-encoding may be a compounded concern because many communication channels may employ multiple hops, which may require repeated DBI application at each node. Performing an ECC decoding, DBI decode, DBI re-encode, and ECC re-encode at each hop may increase latency and power/area overheads within the communication channel.

To address these possible latency or power/area concerns, embodiments herein relate to the application of DBI encoding subsequent to the application of ECC encoding. Particularly, embodiments herein relate to use of a class of codes that may utilize properties of the H matrix to ensure that the ECC syndrome generated is the same regardless of whether DBI has been applied to the data or not. The data may be ECC encoded with the assumption that no DBI as been applied yet, and the H and G matrices used in the ECC encoding are engineered such that any subsequent application of DBI ensures the same ECC syndrome. As used herein, the "G matrix" may refer to a generator matrix G which may be used to encode data in accordance with an ECC algorithm. The "H matrix" may refer to a parity check matrix H which may be used to decode the data and perform error correction on the encoded data. The syndrome may be used to identify data errors. Generally, the syndrome may be equal to $Hx^t$ where "$x^t$" is the transpose of the received data vector.

More generally, embodiments relate to creating a class of error protection codes which are constructed intrinsically in a manner to support an arbitrary number of DBI operations after the original ECC computation has been performed, while still retaining the original error correction capabilities of the ECC code. In fact, the codes may protect even the DBI bits, even if they were not present at the time of the original ECC encoding operation.

Some embodiments may allow for computation of ECC encoding using the bits of the original data message, and then performing ECC decoding in the DBI space (e.g., performing ECC decoding on a DBI encoded message). These embodiments may be particularly appropriate if the DBI is being applied to the entire ECC encoded message.

However, in many embodiments ECC encoding and DBI encoding may be optimal at different bit lengths. ECC codes may have logarithmic overheads and may generally be optimal over 64-512 bits to balance residence and parity storage overheads. By contrast, DBI may be applied over 6-10 bits to maximize energy savings while minimizing power overheads.

To address this bit-length disparity, it may be noted that the majority of ECC codes employed in legacy systems may be linear codes. When using linear codes, if a message is arbitrarily divided into n distinct components, then the overall parity of the message may be the sum of the parity of each component. In this embodiment, a bit of DBI may be applied to every k bits of message. As a result, a DBI encoded message may include (k+1)*n bits. Depending on the DBI encoding decision taken at each of the sub-segments k, the message bit can thus have $2^n$ unique DBI encodings. If an ECC code generates the same syndrome/parity bits for all of these $2^n$ DBI encodings, then some arbitrary combination of DBIs may be applied to each segment k along each link of the communication pathway, and the DBI message may still be a valid codeword for a given code.

As a result, it may be desirable for the code that all n segments of length (k+1) bits have the property that the syndrome for $\{m_i, 0\}$ and $\{\overline{m_i}, 1\}$ are identical. As used herein, $\{m_i, 0\}$ may refer to a portion of a message "$m_i$" and the DBI indicator "0" which may indicate that no inversion is preferred. Similarly, $\{\overline{m_i}; 1\}$ may refer to a portion of a message "$\overline{m_i}$" which is a bit-wise inversion of the message $m_i$, and the DBI indicator "1" which indicates the inversion. As a result of this desire for the syndromes to be identical, the G matrix G may be identified to include (k+1)*n rows and p columns, wherein p is the number of parity bits of the ECC encoding. To fulfill the property of the syndromes, the (k+1) rows of G may sum to zero. Therefore, the code requirement may be summarized as all n submatrices of the overall G matrix G has the property that the rows in each submatrix sums to zero.

The task of obtaining a linear set of columns for the G matrix G may be mapped into a graph coloring problem. However, in many embodiments, a relatively simple search heuristic may be adequate. Specifically, for any desired code, a non-truncated column of the G matrix G may be constructed, and then a recursive search may be performed for groups of the required number of columns that sum to zero within the next vector.

Figure 1:
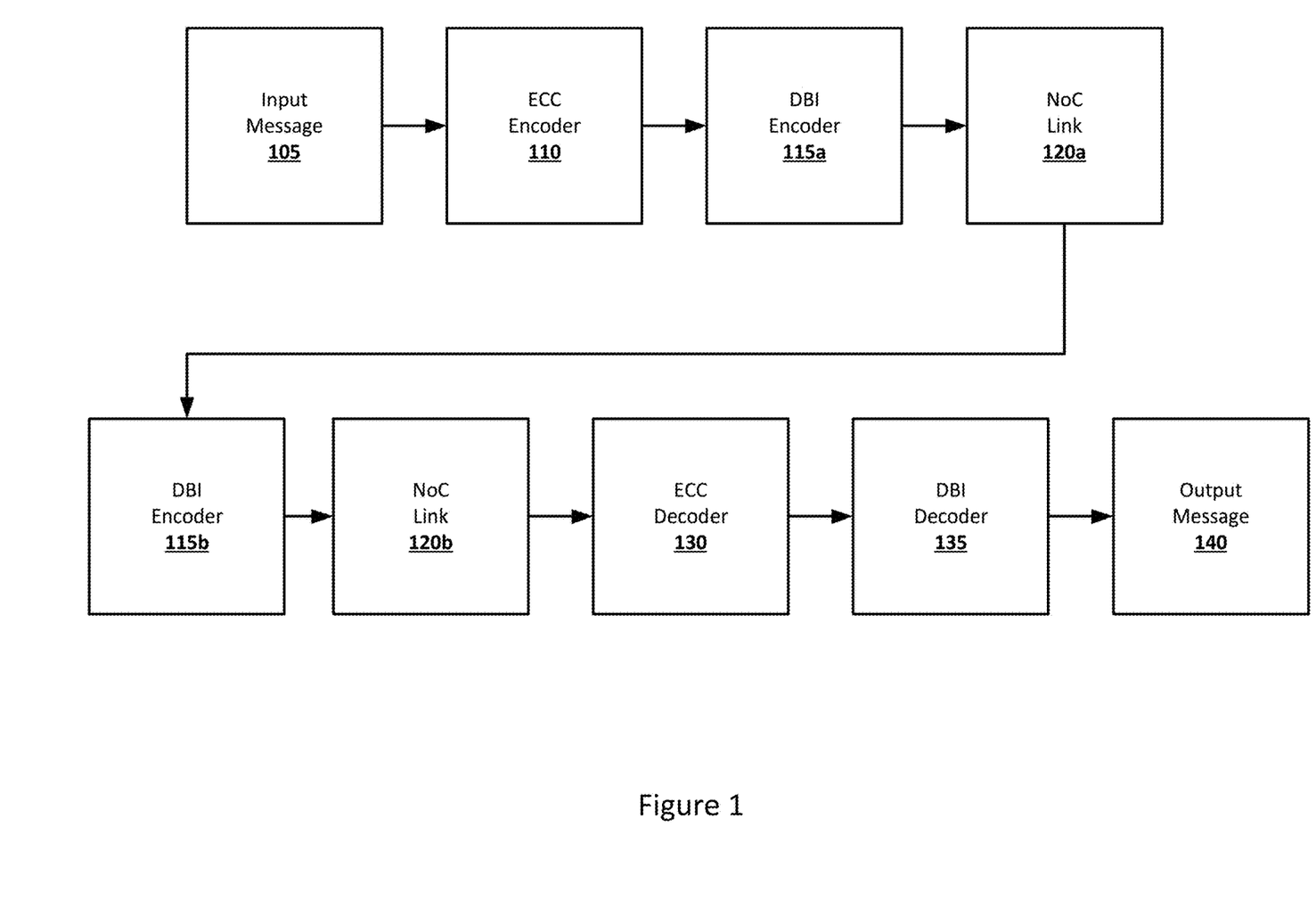
FIG. 1 illustrates an example of an encoding/decoding pathway of a computing device, in accordance with various embodiments.

FIG. 1 illustrates an example of an encoding/decoding pathway of a computing device, in accordance with various embodiments. It will be noted that, based on embodiments herein related to the proposed ECC code discussed above, the ECC encoding and decoding may only be performed once within the communication pathway. Also, it may be noted that although ECC encoding may occur prior to DBI encoding, ECC decoding may occur prior to the final DBI decoding so that the ECC decoding can be used to correct any errors that may have occurred in the transmission prior to the final DBI decoding. The DBI decoding may then be used to recover the original message.

Specifically, as may be seen in FIG. 1, an input message 105 may be input to an ECC encoder 110. The input message may include data from, for example, a processor a memory, and input/output (I/O) chip, a radio frequency (RF) chip or some other element of a computing device. The processor may be, for example, a processor such as a central processing unit (CPU), general processing unit (GPU), a core of a distributed processor, or some other type of processor. The memory may be, for example a double data rate (DDR) memory, a non-volatile memory (NVM), a volatile memory, a read-only memory (ROM), or some other type of memory or die. The RF chip may be, for example, an RF chip or RF circuitry that is configured to generate, process, transmit, or receive a wireless signal such as a third generation (3G), a fourth generation (4G), a fifth generation (5G), a Wi-Fi, or some other type of wireless signal.

The ECC encoder 110 may perform ECC encoding on the input message 105. Specifically, the ECC encoder 110 may perform ECC encoding such as SEC encoding, SECDED encoding, DECTED encoding, or some other type of ECC encoding on the message. The ECC encoding may be performed based on the G matrix discussed above that includes (k+1)*n rows and p columns, and wherein the (k+1) rows of G sum to zero. The ECC encoder may produce n ECC encoded data message. The ECC encoded data message may then be input to a DBI encoder 115a, which may perform DBI encoding on the ECC encoded data message to produce a DBI encoded data message.

In some embodiments, the ECC encoder 110 and the DBI encoder 115a may be elements of a single encoder. The encoder may be implemented in hardware, software, firmware, or some combination thereof. In other embodiments, the ECC encoder 110 and the DBI encoder 115a may be implemented separately from one another.

The DBI encoded data message may then be output along the communication pathway. In some embodiments, the communication pathway may include a number of hops. Specifically, as depicted in FIG. 1, the communication pathway may include a number of network on chip (NoC) links 120a and 120b. The NoC links 120a and 120b may include active or passive circuitry such as amplifiers, attenuators, resistors, capacitors, transistors, etc. which may be used to re-boost or otherwise alter the signal over the length of the communication pathway. As depicted in FIG. 1, the communication pathway may include two NoC links 120a and 120b, however it will be understood that in other embodiments the communication pathway may include more or fewer NoC links. Additionally, although the hops are depicted in FIG. 1 as NoC links, in other embodiments the communication pathway may additionally or alternatively include some other type of link or node which may affect the signal along the length of the communication pathway.

An additional DBI encoder 115b may be desired within the communication pathway prior to a hop in the communication pathway. For example, DBI encoder 115b, which may be similar to DBI encoder 115a, may be positioned between NoC links 120a and 120b. Specifically, the DBI encoder 115b may receive, via NoC link 120a, the DBI encoded signal output by DBI encoder 115a. As noted, in some embodiments the NoC link 120a may boost, attenuate, or other alter the signal and in some cases, it may be desirable to re-perform DBI encoding on the altered signal. Therefore, in some embodiments the DBI encoder 115b may receive the first DBI encoded signal from NoC link 120a, perform DBI encoding on the first DBI encoded signal to produce a second DBI encoded signal, and output the second DBI encoded signal to the NoC link 120b. In some embodiments, the DBI encoder 115b may be considered an element of the NoC link 120a or 120b, while in other embodiments the DBI encoder 115b may be implemented separately from the NoC link 120a or 120b.

The NoC link 120b may then output the second DBI encoded signal to an ECC decoder 130. The ECC decoder 130 may use an H matrix H as described above to decode the second DBI encoded signal and generate an ECC decoded data message. However, as noted above the ECC decoded data message may still be DBI encoded. Therefore, the ECC decoded data message may be output to a DBI decoder 135 which may perform DBI decoding on the ECC decoded data message to generate an output message 140. Generally, the output message 140 may be identical to the input message 105 (barring a link or data failure outside the correction capability of the ECC code the length of the communication pathway).

Similarly to ECC encoder 110 and DBI encoder 115a, the ECC decoder 130 and the DBI decoder 135 may be implemented as a single decoder. Specifically, the ECC decoder 130 and the DBI decoder 135 may be implemented as a single piece of hardware, software, firmware, or some combination thereof. In other embodiments, the ECC decoder 130 and the DBI decoder 135 may be implemented separately from one another.

It will be understood that this communication pathway may be considered to be one example of such a pathway, and other embodiments may include additional elements not depicted in FIG. 1, or fewer elements (e.g., fewer NoC links or other elements) than depicted in FIG. 1. In some embodiments, each of the elements may be implemented in a single computing device, or even on a single printed circuit board (PCB), server sled, or chip within a computing device. In other embodiments, certain of the elements (e.g., the ECC encoder 110 and DBI encoder 115a) may be implemented on different chips or boards than other of the elements (e.g., ECC decoder 130 and DBI decoder 135). In some embodiments, various of the elements may be implemented in different computing devices. For example, the ECC encoder 110 and the DBI encoder 115a may be implemented in one computing device, DBI encoder 115b and NoC link 120b, may be implemented in a different computing device, and ECC decoder 130 and DBI decoder 135 may be implemented in another computing device. Other variations may be present in other embodiments.

Figure 2:
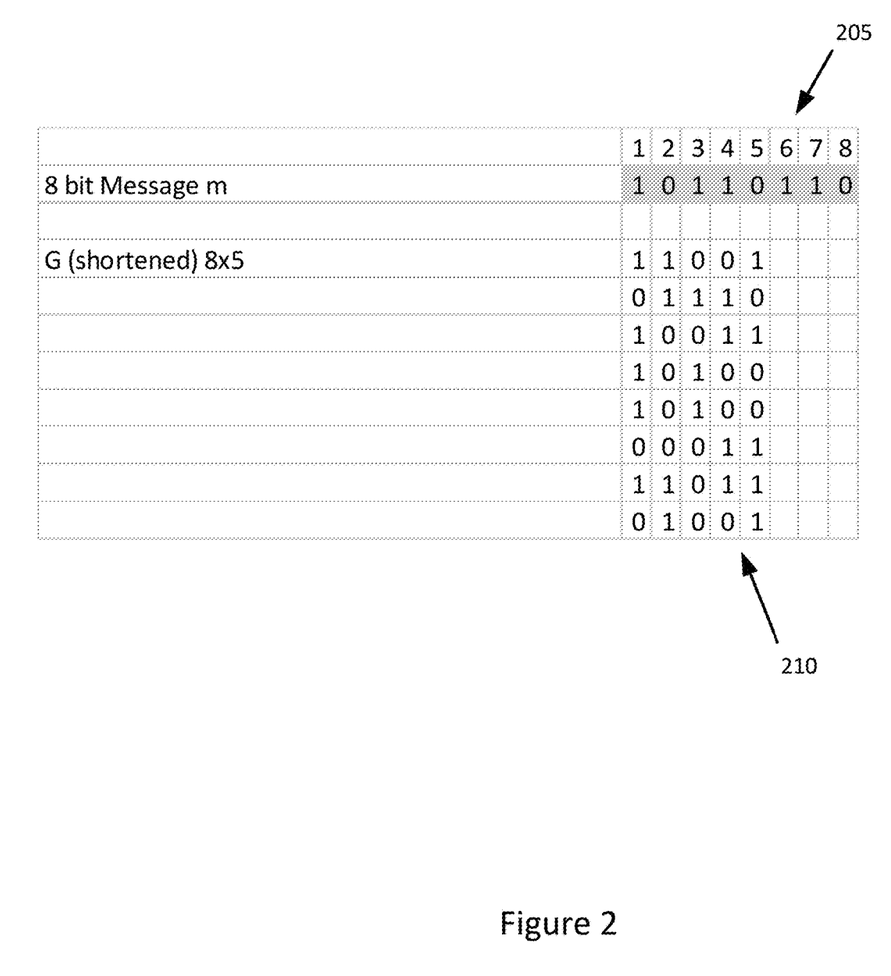
FIG. 2 illustrates a portion of an example of data encoding/decoding, in accordance with various embodiments.
Figure 3:
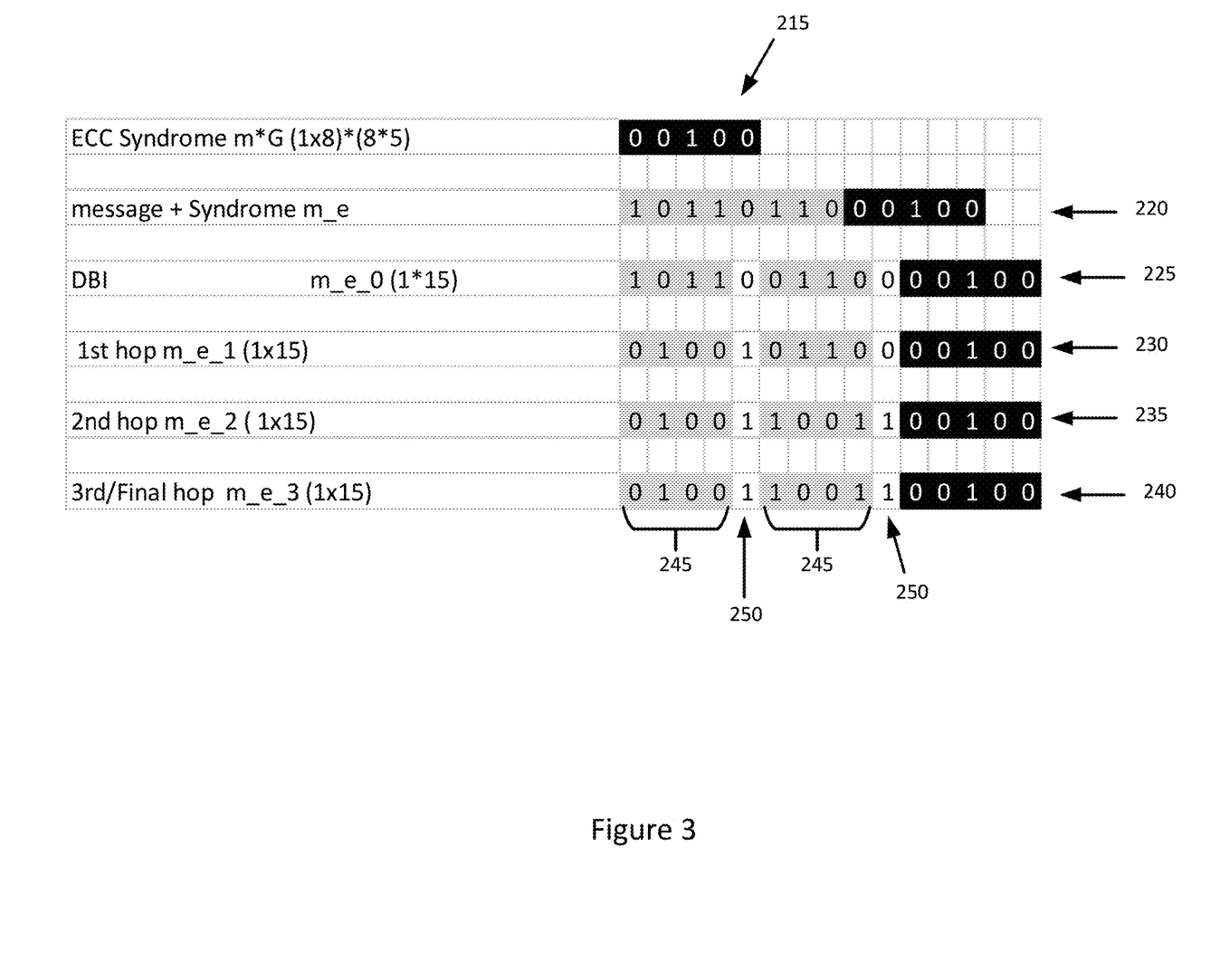
FIG. 3 illustrates another portion of an example of data encoding/decoding, in accordance with various embodiments.
Figure 4:
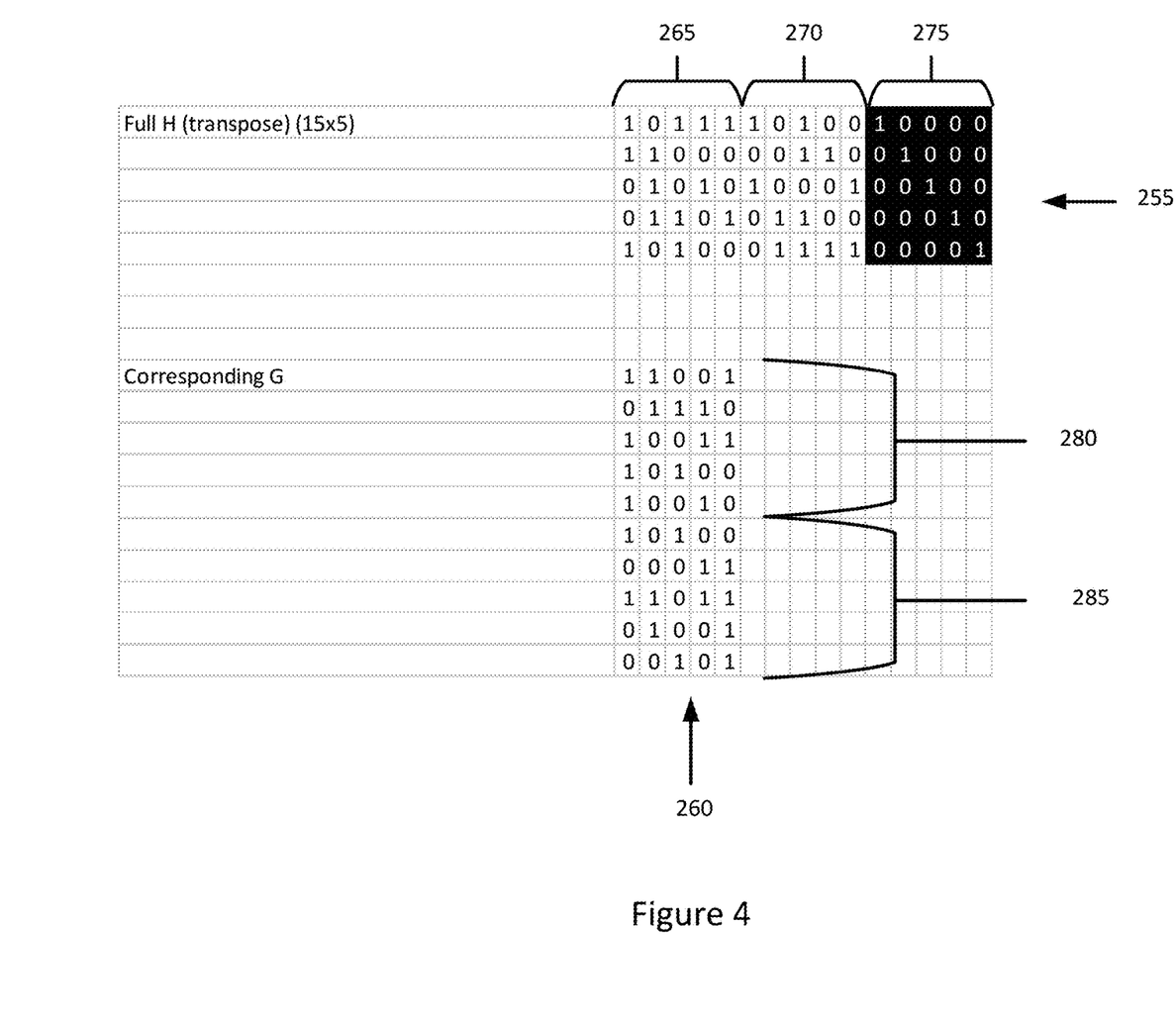
FIG. 4 illustrates another portion of an example of data encoding/decoding, in accordance with various embodiments.

FIGS. 2-4 depict an example of encryption and decryption of a data message, in accordance with embodiments herein. It will be understood that this example is a highly simplified example that relates to encryption/decryption of an 8-bit message, and in other real-world embodiments the encryption/decryption techniques may be more complicated because the message may be significantly longer than 8 bits.

Specifically, the technique may start with an 8-bit message m at 205. The message m may be similar to, for example, the input message at 105. A G matrix G may then be identified a described above. G may be identified, for example, by an ECC encoder such as the ECC encoder at 110. Specifically, the G matrix G shown at 210 may be considered to be a shortened G matrix that includes 5 columns and 8 rows (i.e., an 8×5 matrix). It will be understood that in full systematic form G may be an 8×13 matrix.

The ECC encoder may then use G and m to calculate an ECC syndrome at 215. Specifically, the ECC syndrome may be calculated based on m*G as shown in FIG. 3. The syndrome may then be added to the end of the message at 220 to from an ECC encoded data message $m_e$. Generally, in FIGS. 2 and 3, shading may be used to help identify DBI bits (unshaded), the input message (lightly shaded), and the ECC syndrome (shaded with white numerals). This shading may help identify the different portions of the data within the communication pathway for the sake of this example.

The ECC encoded data message $m_e$ may then be output by the ECC encoder and input to a DBI encoder such as DBI encoder 115a which may perform DBI encoding on the ECC encoded data message $m_e$. Specifically, the DBI encoding may include separating the ECC encoded data message $m_e$ into sub-segments and adding a DBI bit to each sub-segment. Specifically, the DBI encoder may separate the $m_e$ into two sub-segments 245 (i.e., k may be equal to 2 in this example) and append a DBI bit 250 to each sub-segment. As noted above, the DBI bit may be equal to 0 if there is no inversion of the data in the sub-segment k, or it may be equal to 1 if the data within the sub-segment k is inverted. At 225, because the data bits within each sub-segment k are not inverted, the DBI bits 250 may be equal to 0. This application of DBI encoding may extend the message $m_e$ from 13 bits to a 15-bit data vector $m_{e0}$ that is a 1×15 data vector.

As noted with respect to FIG. 1, the communication pathway may then include a number of hops. DBI encoding may be re-performed at each hop. As shown in FIG. 3, the communication pathway may include 3 hops, each of which may be similar to NoC links 120a or 120b. The DBI re-encoding may be performed by a DBI encoder such as DBI encoder 115b. As can be seen in FIG. 3, at the first hop 230 DBI encoding may be applied to $m_{e0}$ to generate another DBI encoded message $m_{e1}$. In this DBI encoding, the first sub-segment 245 k may be bit-wise inverted (e.g., the data bits in the sub-segment that are 0 may be changed to 1, and vice-versa). This inversion may be considered to be changing $m_i$ to $\widetilde{m}_i$, as discussed above. Accordingly, the DBI bit 250 may be changed from "0" to "1."

Similarly, at the second hop 235 DBI encoding may be performed on $m_{e1}$ to generate a DBI encoded message $m_{e2}$. Specifically, in $m_{e2}$, the second sub-segment 245 k may be bit-wise inverted and the DBI bit 250 may be changed from "0" to "1."

At the third hop 240, DBI encoding may be applied to $m_{e2}$ to generate a DBI encoded message $m_{e3}$. As can be seen, no inversion may be performed at the third hop 240, so $m_{e2}$ and $m_{e3}$ may e generally identical to one another. However, with the exception of the syndrome, $m_{e1}$ and $m_{e3}$ may be generally inverted from one another as can be seen in FIG. 3.

$m_{e3}$ may then be input to an ECC decoder such as ECC decoder 130. The ECC decoder may be used to identify whether errors were introduced into the message $m_{e3}$ along the communication pathway. As noted above, the syndrome s (which was calculated at 215 and appended to the message $m_e$ at 220) may be equivalent to $Hx^t$ where "x" is the transpose of the received data vector. Accordingly, H may be calculated by the ECC decoder based on $m_{e3}$. $H^t$ is shown at 255. Specifically, $H^t$ is shown rather than H for ease of depiction, however it will be understood that either H or $H^t$ may be calculated and may be easily derived from one another. $H^t$ may include three sections 265, 270, and 275. Section 265 may relate to a calculation based on the first sub-segment 245 and the first DBI bit 250 of $m_{e3}$. Section 270 may relate to a calculation based on the second sub-segment 245 and the second DBI bit 250 of $m_{e3}$. Section 275 may relate to an imaginary component based on the syndromes of $m_{e3}$. H or $H^t$ may also be used by the ECC decoder to calculate a corresponding generator matrix G at 260. Notably, the generator matrix G may include two sections 280 and 285, which may respectively relate to sections 265 and 270 of $H^t$. The parity check matrix H or $H^t$ at 255 may be used by the ECC decoder to identify whether errors were introduced into $m_{e3}$ along the communication pathway and, if so, to correct the errors in accordance with common ECC decoding techniques.

The ECC decoder may then output an ECC decoded data message to a DBI decoder such as DBI decoder 135. The DBI decoder may apply DBI decoding techniques to the ECC decoded data message as described above to recover the output message 140.

As noted, the above is a simplified example of ECC and DBI encoding/decoding in accordance with various embodiments of the present disclosure. It will be understood that other real-world embodiments may include more or fewer elements such as an increased number of hops, an increased length of the various data messages, different data inversion at one or more of the hops, etc.

Figure 5:
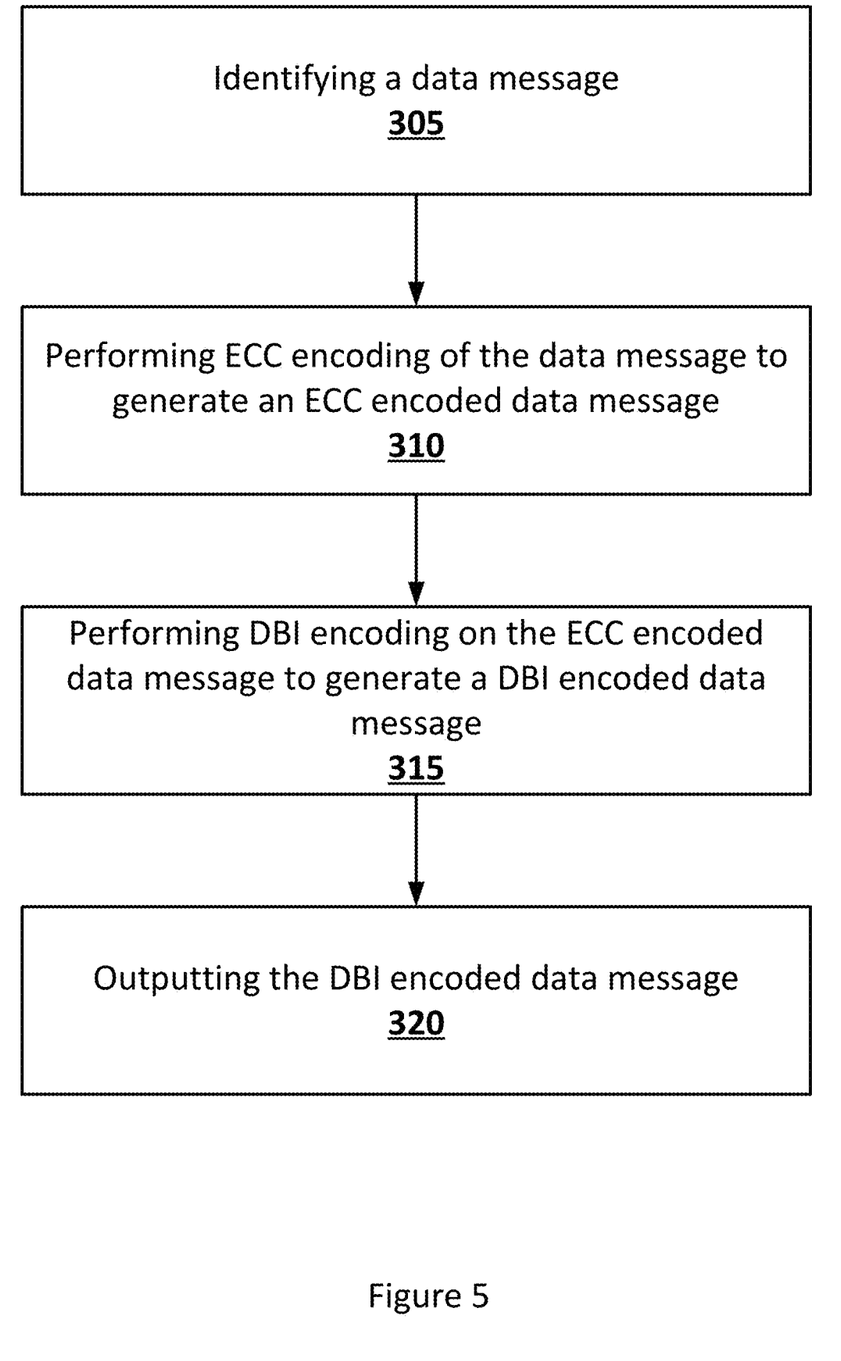
FIG. 5 illustrates an example of an encoding technique which may be used by an encoder, in accordance with various embodiments.

FIG. 5 illustrates an example of an encoding technique which may be used by an encoder, in accordance with various embodiments. The encoder may be, for example, a combination of the ECC encoder 110 and the DBI encoder 115a. As previously noted, the ECC encoder and the DBI encoder may be implemented as a single element (e.g., a single piece of hardware, software, firmware, etc.) or separately from one another. The technique may include identifying, at 305, a data message. The data message may be similar to, for example the input message 105 received by the ECC encoder 110.

The technique may further include performing, at 310, ECC encoding of the data message to generate an ECC encoded data message. The ECC encoding may be similar to the ECC encoding described above with respect to ECC encoder 110 or elements 210/215/220. Specifically, the ECC encoding may include identifying a generator matrix G with the above-described properties, using the generator matrix G to calculate a syndrome s, and appending the syndrome s to a message m to generate an ECC encoded message $m_e$.

The technique may then include performing, at 315, DBI encoding on the ECC encoded data message to generate a DBI encoded data message. The DBI encoding may be performed, for example, by DBI encoder 115a. The application of the DBI encoding may be similar to that described above with respect to, for example DBI encoder 115a or element 225. Specifically, the DBI encoding may include separating the message into k sub-segments 245 and introducing the DBI bits 250 into the message to produce a DBI encoded data message $m_{e0}$. The technique may then include outputting, at 320, the DBI encoded data message to another element along the communication pathway such as a "hop" or an NoC link such as NoC link 120a.

Figure 6:
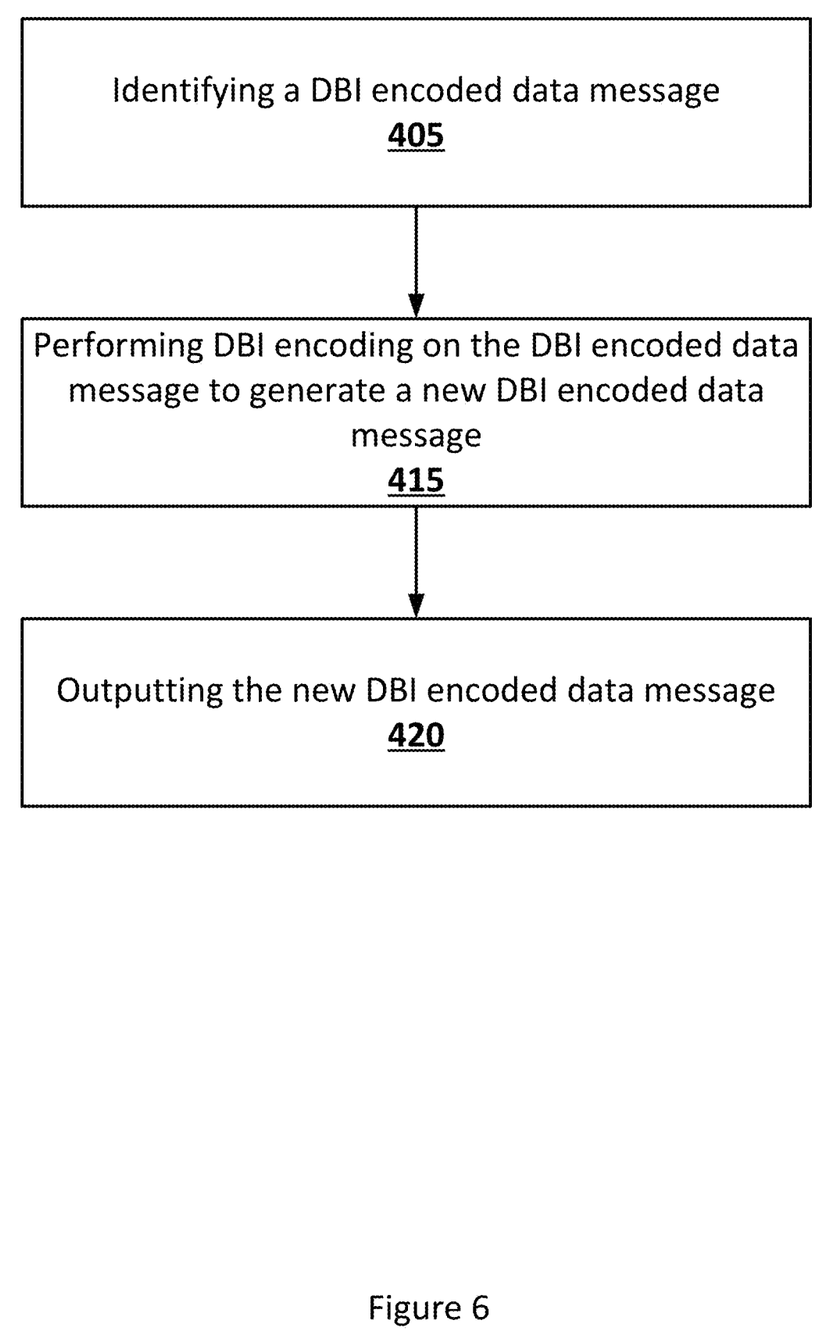
FIG. 6 illustrates an example of DBI encoding which may be used by a hop in a communication pathway, in accordance with various embodiments.

FIG. 6 illustrates an example of DBI encoding which may be used by a hop in a communication pathway, in accordance with various embodiments. For example, the technique of FIG. 6 may be performed by a hop which may include a DBI encoder such as DBI encoder 115b and an NoC link such as NoC link 120a.

Specifically, the technique may include identifying, at 405, a DBI encoded data message. The DBI encoded data message may be, for example, a DBI encoded message output by DBI encoder 115a. More specifically, the DBI encoded data message may be, for example, $m_{e0}$ as described above.

The technique may further include performing, at 415, DBI encoding on the DBI encoded data message to generate a new DBI encoded data message. For example, the DBI encoding may be performed by a DBI encoder such as DBI encoder 115b. The DBI encoding may include performing DBI encoding on $m_{e0}$ to generate, for example $m_{e1}$ at 230.

The technique may then include outputting, at 420, the new DBI encoded data message. For example, the technique may include outputting by the DBI encoder, or the NoC link of which the DBI encoder is a part, the new DBI encoded message $m_{e1}$. For example, the new DBI encoded data message may be output to another NoC link, a different type of hop, or an ECC decoder such as ECC decoder 130.

Figure 7:
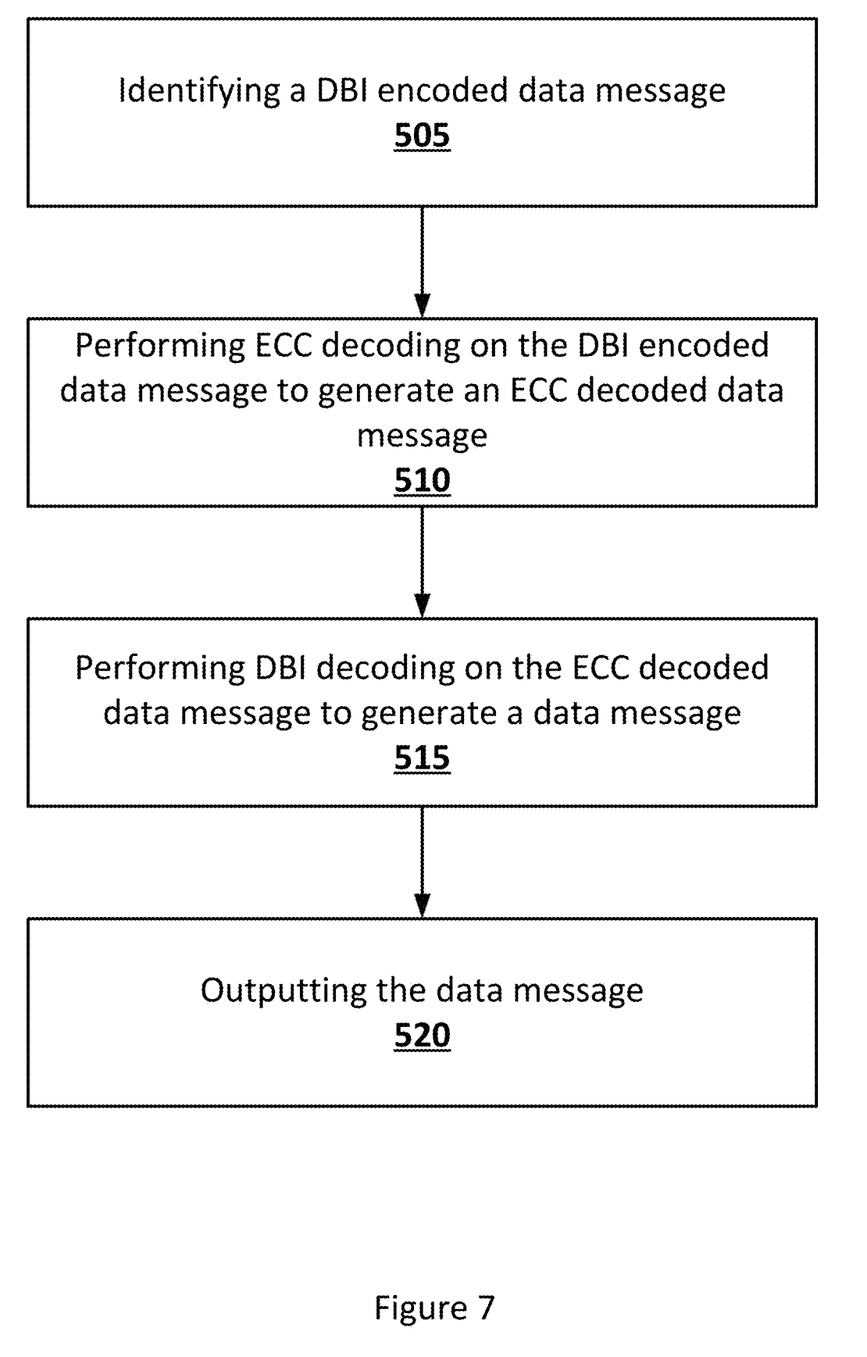
FIG. 7 illustrates an example of a decoding technique which may be used by a decoder, in accordance with various embodiments.

FIG. 7 illustrates an example of a decoding technique which may be used by a decoder, in accordance with various embodiments. The decoder may be or include an ECC decoder such as ECC decoder 130 and a DBI decoder such as DBI decoder 135. As noted previously, the ECC decoder and the DBI decoder may be implemented as a single element (e.g., a single piece of hardware, firmware, software, or combinations thereof), or separately from one another.

The technique may include identifying, at 505, a DBI encoded data message. Element 505 may be performed by the ECC decoder, and the DBI encoded data message may be, for example $m_{e3}$.

The technique may further include performing, at 510, ECC decoding on the DBI encoded data message to generate an ECC decoded data message. Element 510 may be performed, for example, by the ECC decoder. Performing the ECC decoding may be similar to the decoding described above with respect to the ECC decoder 130 or elements 255/260 of FIG. 4. More specifically, the ECC decoding may include the identification and correction of bit errors within $m_{e3}$. The ECC decoding may generate an ECC decoded data message which may then be output, for example to the DBI decoder.

The technique may then include performing, at 515, DBI decoding on the ECC decoded data message to generate a data message. The DBI decoding may be performed, for example, by the DBI decoder and may be similar to the DBI decoding described above with respect to DBI decoder 135 to generate a data message such as output message 140. The technique may then include outputting the data message at 520.

It will be understood that the above-described techniques of FIGS. 5-7 may be considered examples, and other embodiments may include more or fewer elements than depicted or discussed. In some embodiments, certain of the elements may be performed in a different order than depicted, or concurrently with one another. As one example, depending on the decoding techniques used, elements 515 and 520 may be performed generally concurrently with one another if decoding is being performed on one portion of data while another decoded portion of the data is being output. Other variations may be present in other embodiments.

Figure 8:
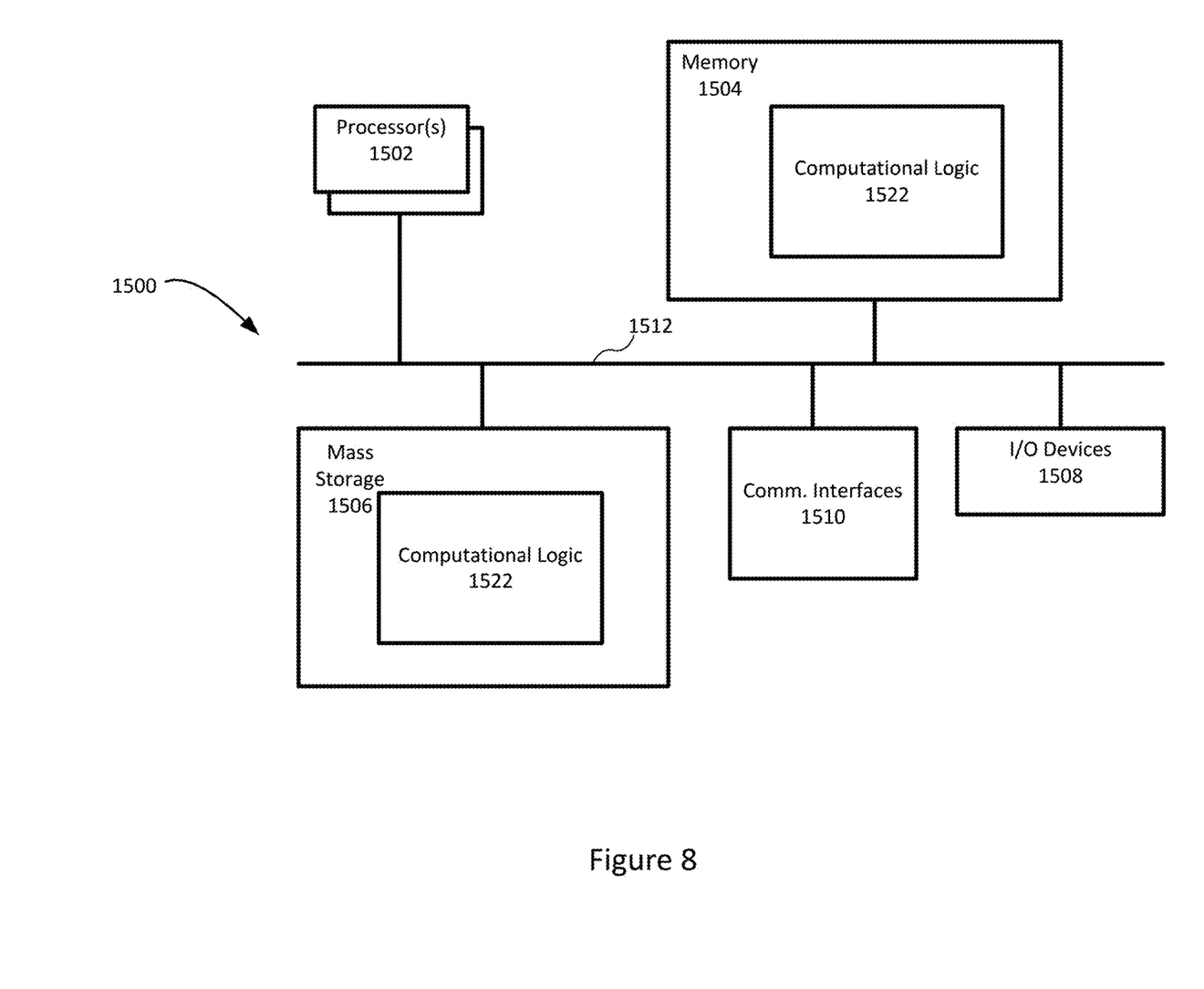
FIG. 8 illustrates an example device that may use various embodiments herein, in accordance with various embodiments.

FIG. 8 illustrates an example computing device 1500 suitable for use with various embodiments herein. As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random access memory (DRAM), compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable ROM, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include various communication pathways as discussed herein. For example, various elements such as the processor 1502, the memory 1504, or some other element may generate an input message such as input message 105. The element may further include various encoders such as ECC encoder 110, DBI encoder 115a, etc. The encoded message may be output to system bus 1512 which may include the hops such as NoC links 120a/120b, DBI encoder 115b, etc. The message may then be received by another element such as processor 1502, memory 1504, or some other element where it is decoded by a decoder such as ECC decoder 130 or DBI decoder 135.

In other embodiments, the encoded message may be output by communication interfaces 1510, I/O devices 1508, or some other element to a communication pathway. It may then traverse a communication pathway between two computing or electronic systems, and this communication pathway may include the NoC links 120a/120b or DBI encoder 115b. It may then be received by another computing or electronic system which may then decode it as described herein.

EXAMPLES OF VARIOUS EMBODIMENTS

Example 1 includes an electronic device comprising: a processor to generate a data message; an error correction code (ECC) encoder communicatively coupled with the processor, wherein the ECC encoder is to perform ECC encoding on the data message to generate an ECC encoded data message; and a data bus inversion (DBI) encoder communicatively coupled with the ECC encoder, wherein the DBI encoder is to perform DBI encoding on the ECC encoded data message to generate a DBI encoded data message.

Example 2 includes the electronic device of example 1, wherein the DBI encoder is to perform DBI encoding on a portion of the ECC encoded data message that is less than the ECC encoded data message.

Example 3 includes the electronic device of example 1, wherein the DBI encoded data message is a first DBI encoded data message, and wherein the electronic device further comprises an ECC decoder communicatively coupled with the DBI encoder; wherein the ECC decoder is to perform ECC decoding on a second DBI encoded data message to generate an ECC decoded message; and wherein the second DBI encoded data message is related to the first DBI encoded data message.

Example 4 includes the electronic device of example 3, wherein the second DBI encoded data message is the same as the first DBI encoded data message.

Example 5 includes the electronic device of example 3, wherein the second DBI encoded data message is based on DBI encoding of the first DBI encoded data message.

Example 6 includes the electronic device of example 5, wherein the DBI encoding of the first DBI encoded data message and the second DBI encoded data message is performed without an intermediate ECC encoding or decoding.

Example 7 includes the electronic device of example 3, further comprising a DBI decoder communicatively coupled with the ECC decoder, wherein the DBI decoder is to perform DBI decoding on the ECC decoded message to generate the data message.

Example 8 includes the electronic device of any of examples 1-7, wherein the DBI encoding is based on use of a G matrix wherein each row of the G matrix sums to 0.

Example 9 includes the electronic device of any of examples 1-7, wherein the ECC encoder is to perform the ECC encoding in accordance with a single-error correcting (SEC) algorithm.

Example 10 includes a method of data transfer, the method comprising: identifying, at an encoder, a data message; performing, by the encoder, error correction coding (ECC) encoding of the data message to generate an ECC encoded data message; performing, by the encoder, data bus inversion (DBI) encoding on the ECC encoded data message to generate a DBI encoded data message; and outputting, by the encoder, the DBI encoded data message.

Example 11 includes the method of example 10, wherein the DBI encoding is based on use of a G matrix with a property that each row of the G matrix sums to 0.

Example 12 includes the method of example 11, further comprising generating the G matrix.

Example 13 includes the method of any of examples 10-12, further comprising: identifying n subsets of data of the ECC encoded data message; and performing the DBI encoding on respective ones of the subsets of data of the ECC encoded data message to generate n subsets of the DBI encoded data message.

Example 14 includes the method of example 13, wherein a subset of the DBI encoded data message includes k bits of data and 1 bit of DBI data.

Example 15 includes the method of example 14, wherein a length of the DBI encoded data message is (k+1)*n.

Example 16 includes one or more non-transitory computer-readable media comprising instructions that, when executed by a processor of a computing device, are to cause a decoder of the computing device to: identify a data bus inversion (DBI) encoded data message, wherein the DBI encoded data message is based on application of DBI encoding subsequent to application of error correction coding (ECC) encoding; perform ECC decoding on the DBI encoded data message to generate an ECC decoded data message; and perform DBI decoding on the ECC decoded data message to generate a data message; and output the data message.

Example 17 includes the one or more non-transitory computer-readable media of example 16, wherein the DBI encoding is based on use of a G matrix with a property that each row of the G matrix sums to 0.

Example 18 includes the one or more non-transitory computer-readable media of example 16, wherein the DBI encoded data message is based on multiple iterations of DBI encoding of an ECC encoded message.

Example 19 includes the one or more non-transitory computer-readable media of example 18, wherein the multiple iterations of DBI encoding are performed without further iterations of ECC encoding or ECC decoding.

Example 20 includes the one or more non-transitory computer-readable media of any of examples 16-19, wherein the DBI encoding is performed on portions of a message generated by the ECC encoding.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. An electronic device comprising:
a processor to generate a data message;
an error correction code (ECC) encoder communicatively coupled with the processor, wherein the ECC encoder is to perform ECC encoding on the data message to generate an ECC encoded data message; and
a data bus inversion (DBI) encoder communicatively coupled with the ECC encoder, wherein the DBI encoder is to perform DBI encoding on the ECC encoded data message to generate a DBI encoded data message.

2. The electronic device of claim 1, wherein the DBI encoder is to perform DBI encoding on a portion of the ECC encoded data message that is less than the ECC encoded data message.

3. The electronic device of claim 1, wherein the DBI encoded data message is a first DBI encoded data message, and wherein the electronic device further comprises an ECC decoder communicatively coupled with the DBI encoder;
wherein the ECC decoder is to perform ECC decoding on a second DBI encoded data message to generate an ECC decoded message; and
wherein the second DBI encoded data message is related to the first DBI encoded data message.

4. The electronic device of claim 3, wherein the second DBI encoded data message is the same as the first DBI encoded data message.

5. The electronic device of claim 3, wherein the second DBI encoded data message is based on DBI encoding of the first DBI encoded data message.

6. The electronic device of claim 5, wherein the DBI encoding of the first DBI encoded data message and the second DBI encoded data message is performed without an intermediate ECC encoding or decoding.

7. The electronic device of claim 3, further comprising a DBI decoder communicatively coupled with the ECC decoder, wherein the DBI decoder is to perform DBI decoding on the ECC decoded message to generate the data message.

8. The electronic device of claim 1, wherein the DBI encoding is based on use of a G matrix wherein each row of the G matrix sums to 0.

9. The electronic device of claim 1, wherein the ECC encoder is to perform the ECC encoding in accordance with a single-error correcting (SEC) algorithm.

10. A method of data transfer, the method comprising:
identifying, at an encoder, a data message;
performing, by the encoder, error correction coding (ECC) encoding of the data message to generate an ECC encoded data message;
performing, by the encoder, data bus inversion (DBI) encoding on the ECC encoded data message to generate a DBI encoded data message; and
outputting, by the encoder, the DBI encoded message.

11. The method of claim 10, wherein the DBI encoding is based on use of a G matrix with a property that each row of the G matrix sums to 0.

12. The method of claim 11, further comprising generating the G matrix.

13. The method of claim 10, further comprising:
identifying n subsets of data of the ECC encoded data message; and
performing the DBI encoding on respective ones of the subsets of data of the ECC encoded data message to generate n subsets of the DBI encoded data message.

14. The method of claim 13, wherein a subset of the DBI encoded data message includes k bits of data and 1 bit of DBI data.

15. The method of claim 14, wherein a length of the DBI encoded data message is $(k+1)*n$.

16. One or more non-transitory computer-readable media comprising instructions that, when executed by a processor of a computing device, are to cause a decoder of the computing device to:
identify a data bus inversion (DBI) encoded data message, wherein the DBI encoded data message is based on application of DBI encoding to a message encoded by error correction coding (ECC) encoding;
perform ECC decoding on the DBI encoded data message to generate an ECC decoded data message;
perform DBI decoding on the ECC decoded data message to generate a data message; and
output the data message.

17. The one or more non-transitory computer-readable media of claim 16, wherein the DBI encoding is based on use of a G matrix with a property that each row of the G matrix sums to 0.

18. The one or more non-transitory computer-readable media of claim 16, wherein the DBI encoded data message is based on multiple iterations of DBI encoding of an ECC encoded message.

19. The one or more non-transitory computer-readable media of claim 18, wherein the multiple iterations of DBI encoding are performed without further iterations of ECC encoding or ECC decoding.

20. The one or more non-transitory computer-readable media of claim 16, wherein the DBI encoding is performed on portions of a message generated by the ECC encoding.

* * * * *

UNITED STATES PATENT AND TRADEMARK OFFICE
CERTIFICATE OF CORRECTION

PATENT NO. : 10,862,622 B2
APPLICATION NO. : 16/420504
DATED : December 8, 2020
INVENTOR(S) : Vivek Joy Kozhikkottu et al.

Page 1 of 1

It is certified that error appears in the above-identified patent and that said Letters Patent is hereby corrected as shown below:

On the Title Page

In item (57), in the Abstract, Column 2, Delete "aa" and insert -- a --, therefor Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*